(12) United States Patent
Sung et al.

(10) Patent No.: US 9,172,033 B2
(45) Date of Patent: Oct. 27, 2015

(54) MRAM DEVICE AND FABRICATION METHOD THEREOF

(71) Applicant: Taiwan Semiconductor Manufacturing Company, Ltd., Hsin-Chu (TW)

(72) Inventors: Fu-Ting Sung, Yangmei (TW);
Wei-Hang Huang, Kaohsiung (TW);
Chern-Yow Hsu, Chu-Bei (TW);
Shih-Chang Liu, Alian Township (TW);
Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/935,210

(22) Filed: Jul. 3, 2013

(65) Prior Publication Data

US 2015/0008546 A1 Jan. 8, 2015

(51) Int. Cl.
*H01L 29/82* (2006.01)
*H01L 43/12* (2006.01)
*H01L 43/08* (2006.01)
*H01L 27/22* (2006.01)

(52) U.S. Cl.
CPC ............. *H01L 43/12* (2013.01); *H01L 43/08* (2013.01); *H01L 27/222* (2013.01)

(58) Field of Classification Search
CPC ....... H01L 43/08; H01L 27/22; H01L 43/065; G11C 11/16
USPC ....................... 257/421–427, E29.323; 438/3; 365/157–158, 171–173; 360/324–326
See application file for complete search history.

(56) References Cited

U.S. PATENT DOCUMENTS

| | | |
|---|---|---|
| 2006/0276034 A1 | 12/2006 | Blanchard |
| 2007/0048950 A1 | 3/2007 | Kanakasabapathy et al. |
| 2008/0003701 A1 | 1/2008 | Chen et al. |
| 2009/0085132 A1 | 4/2009 | Kao et al. |
| 2009/0209050 A1 | 8/2009 | Wang et al. |
| 2009/0261437 A1 | 10/2009 | Kang et al. |
| 2010/0072566 A1 | 3/2010 | Kang et al. |
| 2011/0049656 A1 | 3/2011 | Li et al. |
| 2011/0235217 A1* | 9/2011 | Chen et al. .................. 360/324.2 |
| 2012/0205764 A1 | 8/2012 | Chen et al. |
| 2013/0026585 A1 | 1/2013 | Sung et al. |
| 2013/0099336 A1* | 4/2013 | Min-Hwa et al. ............. 257/421 |

* cited by examiner

*Primary Examiner* — Jami M Valentine
(74) *Attorney, Agent, or Firm* — Slater & Matsil, L.L.P.

(57) ABSTRACT

A method of forming and a magnetoresistive random access memory (MRAM) device. In an embodiment, the MRAM device includes a magnetic tunnel junction (MTJ) disposed over a bottom electrode, the magnetic tunnel junction having a first sidewall, a top electrode disposed over the magnetic tunnel junction, and a dielectric spacer supported by the magnetic tunnel junction and extending along sidewalls of the top electrode, the dielectric spacer having a second sidewall substantially co-planar with the first sidewall of the magnetic tunnel junction.

20 Claims, 5 Drawing Sheets

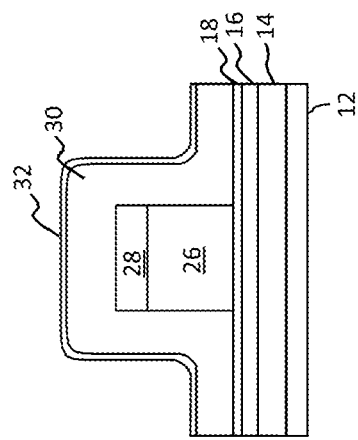
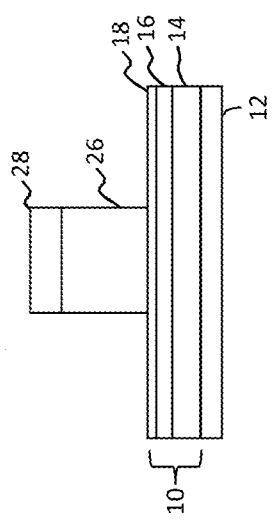
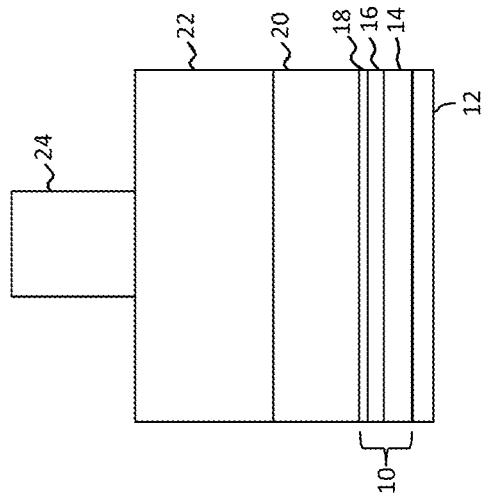

MRAM DEVICE AND FABRICATION METHOD THEREOF

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1-10 collectively and schematically illustrate an embodiment method of forming a magnetoresistive random access memory (MRAM) device;

DETAILED DESCRIPTION OF ILLUSTRATIVE EMBODIMENTS

Figure 6:
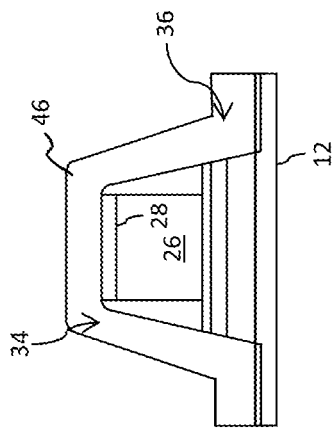

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely magnetoresistive random access memory (MRAM) devices. Other embodiments may also be applied, however, to other semiconductor structures.

FIGS. 1-10 collectively and schematically illustrate an embodiment method of forming a magnetoresistive random access memory (MRAM) device. As shown in FIG. 1, several magnetic tunnel junction (MTJ) layers 10 are formed over a bottom electrode layer 12. In an embodiment, the magnetic tunnel junction layers 10 include an anti-ferromagnetic layer 14, a pinning layer 16, and a free layer 18. However, it should be recognized that different Magnetic tunnel junction layers 10 may also be present in practical applications. For example, magnetic tunnel junction layers 10 may include a tunnel barrier layer. In addition, more or fewer magnetic tunnel junction layers 10 may be incorporated into the MRAM device.

In an embodiment, the anti-ferromagnetic layer 14 is formed on the bottom electrode layer 12, the pinning layer 16 is formed on the anti-ferromagnetic layer 14, and the free layer 18 is formed on the pinning layer 16 as shown in FIG. 1. However, other arrangements of the magnetic tunnel junction layers 10 are contemplated. In an embodiment, the anti-ferromagnetic layer 14, the pinning layer 16, and the free layer 18 are sequentially formed. In an embodiment, the anti-ferromagnetic layer 14, the pinning layer 16, and the free layer 18 are formed conformally.

In an embodiment, the pinning layer 16 is formed of platinum manganese (PtMn). In an embodiment, the anti-ferromagnetic layer 14 is formed of iridium manganese (IrMn), platinum manganese (PtMn), iron manganese (FeMn), ruthenium manganese (RuMn), nickel manganese (NiMn), and palladium platinum manganese (PdPtMn), and the like, or alloys thereof. In an embodiment, the free layer 18 is formed of Cobalt-Iron-Boron (CoFeB). If included within the Magnetic tunnel junction layers 10, a tunnel barrier layer may be formed from magnesium oxide (MgO). It should be recognized that the various Magnetic tunnel junction layers 10 may be formed of other materials in other embodiments.

Still referring to FIG. 1, a top electrode layer 20 is formed over the Magnetic tunnel junction layers 10. In an embodiment, the top electrode layer 20 is formed on the free layer 18. Each of the bottom electrode layer 12 and the top electrode layer 20 may be copper, aluminum, tantalum, tungsten, tantalum nitride (TaN), titanium, titanium nitride (TiN), the like, and/or a combination thereof. Each of the bottom electrode layer 12 and the top electrode layer 20 may be formed by acceptable deposition techniques, such as chemical vapor deposition (CVD), atomic layer deposition (ALD), physical vapor deposition (PVD), the like, and/or a combination thereof.

As shown in FIG. 1, a hard mask layer 22 is formed over the top electrode layer 20. In an embodiment, the hard mask layer 22 is formed from a dielectric material. For example, the hard mask layer 22 may be silicon carbide (SiC), silicon oxynitride (SiON), silicon nitride (SiN), silicon dioxide ($SiO_2$), the like, and/or a combination thereof. The hard mask layer 22 may be formed by acceptable deposition techniques, such as CVD, ALD, PVD, the like, and/or a combination thereof.

Still referring to FIG. 1, a resist structure 24 is formed over the hard mask layer 22. In an embodiment, the resist structure 24 is a photoresist suitable for use with a photo lithography process. In an embodiment, the resist structure 24 is an ashing removable dielectric (ARD), which is a photoresist-like material generally having generally the properties of a photoresist and amendable to etching and patterning like a photoresist.

Referring now to FIG. 2, an etching or other removal process is performed in order to remove portions of the hard mask layer 22 and underlying top electrode layer 20 not protected by the resist structure 24. The hard mask layer 22 and underlying top electrode layer 20 may be etched using acceptable photolithography techniques, such as by using an anisotropic etch. After removing portions of the hard mask layer 22 and underlying top electrode layer 20 disposed beyond the resist structure 24, a top electrode 26 having a hard mask cover 28 remain as shown in FIG. 2.

Referring now to FIG. 3, the magnetic tunnel junction layers 10, the top electrode 26, and the hard mask cover 28 are capped with a first dielectric layer 30. In an embodiment, the first dielectric layer 30 is an oxide, silicon nitride (SiN), or another suitable material. The first dielectric layer 30 may be formed by acceptable deposition techniques, such as CVD, ALD, PVD, the like, and/or a combination thereof. As shown, a thin oxide layer 32 may form over the first dielectric layer 30 due to oxidation.

Figure 4:
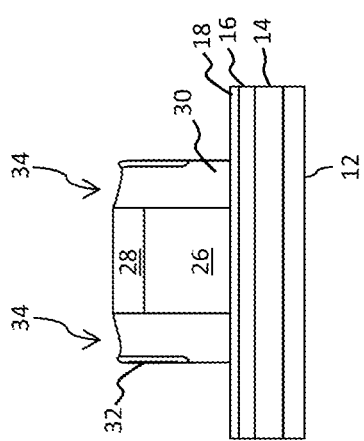

Moving on to FIG. 4, horizontal portions of the first dielectric layer 30 are removed. By removing the horizontal portions of the first dielectric layer 30, portions of the free layer 18 (or the uppermost of the magnetic tunnel junction layers 10) and the hard mask cover 28 are exposed. Moreover, a first dielectric spacer 34 in an intermediate stage is generated. In an embodiment, some of the thin oxide layer 32 remains on the first dielectric spacer 34 after the horizontal portions of the first dielectric layer 30 have been removed.

Figure 5:
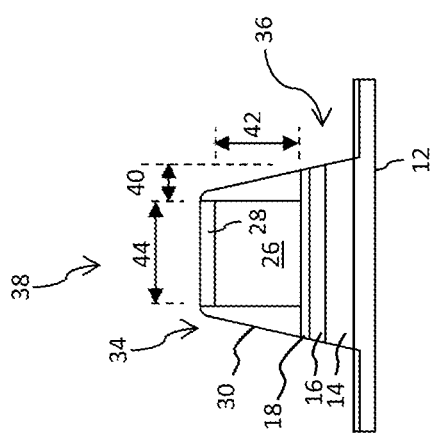

Referring now to FIG. 5, a patterning process is performed to remove peripheral portions of the magnetic tunnel junction layers 10 and the first dielectric layer 30. In an embodiment, the patterning/removal process is accomplished using acceptable lithography techniques. By removing the peripheral portions, the first dielectric spacer 34 in a subsequent or final stage is generated. In addition, a magnetic tunnel junction (MTJ) 36 is formed beneath the first dielectric spacer 34.

In an embodiment, the patterning process thins the hard mask cover 28 disposed over the top electrode 26. With the removal of the peripheral portions of the magnetic tunnel junction layers 10 and the first dielectric layer 30 (and perhaps the thinning of the hard mask cover 28), a magnetoresistive random access memory (MRAM) device 38 in a first configuration is formed as shown in FIG. 5.

As shown in FIG. 5, the first dielectric spacer 34 of the magnetoresistive random access memory device 38 is supported from below by the underlying magnetic tunnel junction 36. In an embodiment, the first dielectric spacer 34 is disposed directly upon, and supported by, the free layer 18 of the magnetic tunnel junction 36. Also, the first dielectric spacer 34 generally extends along the sidewalls of the top electrode 26. In addition, the first dielectric spacer 34 generally surrounds or encircles sidewalls of the hard mask cover 28.

Still referring to FIG. 5, after the patterning/removal process, the remaining portions of the thin oxide layer 32 of FIG. 4 have been removed from the sidewalls of the first dielectric spacer 34.

As shown in FIG. 5, after the patterning/removal process, in an embodiment the first dielectric spacer 34 has a tapering width from a bottom to a top thereof. In other words, the first dielectric spacer 34 has a generally sloping profile. Indeed, the sidewalls of the first dielectric spacer 34 may be co-planar with the sidewalls of the magnetic tunnel junction 36. In an embodiment, a width 40 of the first dielectric spacer 34 is greater than a top electrode height 42 and a top electrode width 44.

Referring now to FIG. 6, the hard mask cover 28, the first dielectric spacer 34, the magnetic tunnel junction 36, and the bottom electrode layer 12 are capped or overlaid with a second dielectric layer 46. The second dielectric layer 46 of FIG. 6 and the first dielectric layer 30 of FIG. 3 may be formed of the same or different materials. In addition, the second dielectric layer 46 of FIG. 6 and the first dielectric layer 30 of FIG. 3 may be formed using the same or different deposition processes.

Figure 7:
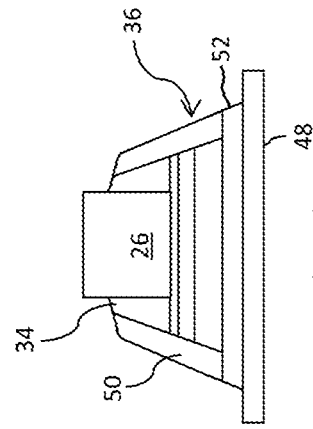
Figure 8:
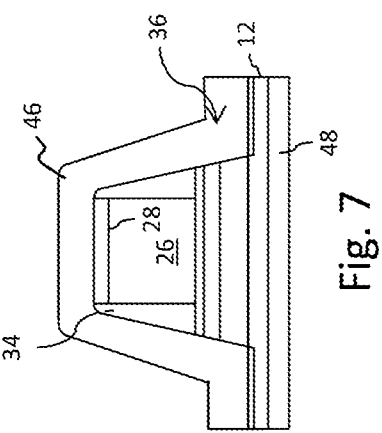

Referring now to FIG. 7, in an embodiment the bottom electrode layer 12 is disposed over, and supported by, a substrate 48. In an embodiment, the underlying substrate 48 is formed from a dielectric material or other suitable substrate material. Referring collectively to FIGS. 7-8, another patterning process is performed to remove portions of the second dielectric layer 46 and the bottom electrode layer 12. In an embodiment, the patterning/removal process is accomplished using acceptable lithography techniques. As shown in FIG. 8, the patterning process generates a second dielectric spacer 50 and a bottom electrode 52. The patterning process also exposes and/or shapes the top electrode 26.

In an embodiment, the second dielectric spacer 50 is disposed along sidewalls of the magnetic tunnel junction 36. In an embodiment, the second dielectric spacer 50 is disposed along sidewalls of the first dielectric spacer 34. As shown, the second dielectric spacer 50 is disposed over, and supported by, the bottom electrode 52.

Figure 9:
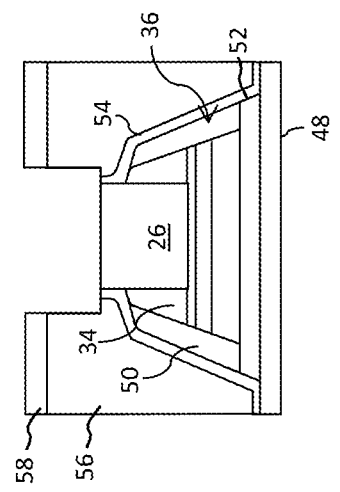

Referring now to FIG. 9, a third dielectric layer 54 is deposited or otherwise formed over exposed portions of the substrate 48, the bottom electrode 52, the second dielectric spacer 50, the first dielectric spacer 34, and the top electrode 26. Thereafter, an extremely low-k dielectric (ELK) layer 56 is formed over the third dielectric layer 54.

Figure 10:
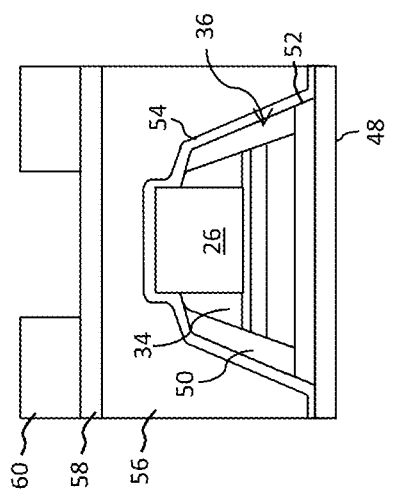

Still referring to FIG. 9, in an embodiment a nitrogen-free anti-reflective coating (NFARC) 58 is formed over the extremely low-k dielectric layer 56. Then, using a resist structure 60 (e.g., a photoresist or ashing removable dielectric) and acceptable lithography techniques, a cavity 62 as shown in FIG. 10 is formed through the extremely low-k dielectric layer 56 and the nitrogen-free anti-reflective coating 58 to expose the top electrode 26. In an embodiment, the extremely low-k dielectric layer 56 is carbon doped silicon dioxide or another suitable extra low-k dielectric material. After the cavity 62 has been formed, an augmented magnetoresistive random access memory (MRAM) device 64 has been formed.

Figure 11:
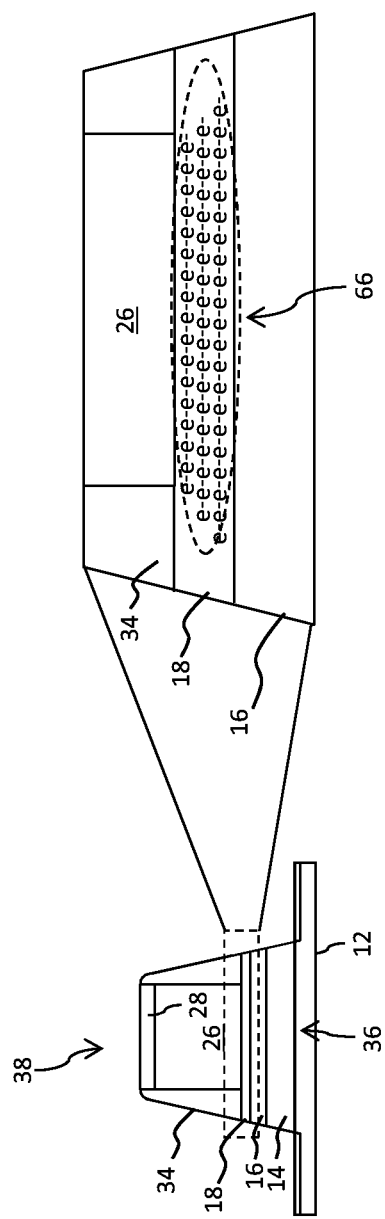
FIG. 11 illustrates a free layer functional area from an embodiment MRAM device.

Referring now to FIG. 11, a free layer functional area 66 within the free layer 18 of the embodiment MRAM device 38 of FIG. 5 is illustrated. Although not expressly illustrated, it should be recognized that the free functional area 66 is also present the in magnetoresistive random access memory device 64 of FIG. 10. Notably, the free layer functional area 66 is protected by the first dielectric spacer 34. As shown, the free layer functional area 66 is disposed beneath both the top electrode 26 and the first dielectric spacer 34. In other words, in an embodiment the free layer functional area 66 in the magnetoresistive random access memory devices 64, 38 extends laterally beyond the periphery of the top electrode 26.

Figure 12:
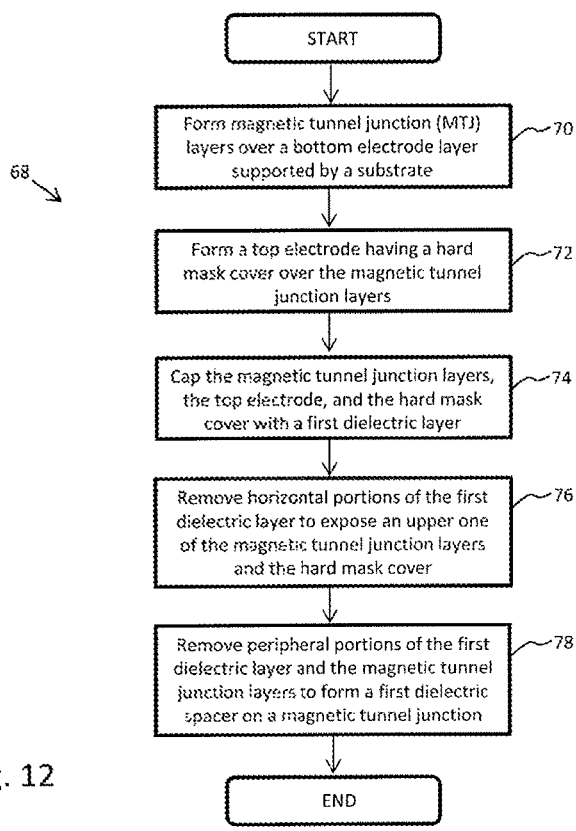
FIG. 12 illustrates an embodiment method for forming a MRAM device.

Referring now to FIG. 12, a method 68 for forming a magnetoresistive random access memory (MRAM) device is illustrated. In block 70, magnetic tunnel junction (MTJ) layers are formed over a bottom electrode layer supported by a substrate. In block 72, a top electrode having a hard mask cover is formed over the magnetic tunnel junction layers. In block 74, the magnetic tunnel junction layers, the top electrode, and the hard mask cover are capped with a first dielectric layer. In block 76, horizontal portions of the first dielectric layer are removed to expose an upper one of the magnetic tunnel junction layers and the hard mask cover. In block 78, peripheral portions of the first dielectric layer and the magnetic tunnel junction layers are removed to form a first dielectric spacer supported by a central portion of the magnetic tunnel junction layers.

From the foregoing, it should be appreciated that the magnetoresistive random access memory devices 38, 64 have numerous advantages. For example, the first dielectric spacer 34 and/or the hard mask cover 28 of the magnetoresistive random access memory devices 38, 64 protects the top electrode 26 from oxidation. As such, the diffusion of oxygen to the free layer 18 is mitigated or prevented. Moreover, the first dielectric spacer 34 and/or the second dielectric spacer 50 provide a dummy distance for the free layer 18 such that any free layer 18 sidewall damage can be ignored. Further, the "metallic" polymer (i.e., the top electrode 26) is reduced by the first dielectric spacer 34.

In addition, the wafer acceptance tests (WAT) and the circuit probe (CP) yield of the magnetoresistive random access memory devices 38, 64 in improved relative to conventional devices. Also, the process flow for the magnetoresistive random access memory devices 38, 64 may be shortened and save, for example, the cost of a mask (or masks) relative to, for example, the process flow employed in U.S. application Ser. No. 13/190,966, filed on Jul. 26, 2011, entitled "MRAM Device and Fabrication Method Thereof," which application is hereby incorporated herein by reference.

An embodiment MRAM device includes a magnetic tunnel junction (MTJ) disposed over a bottom electrode, the magnetic tunnel junction having a first sidewall, a top electrode disposed over the magnetic tunnel junction, and a dielectric spacer supported by the magnetic tunnel junction and extending along sidewalls of the top electrode, the dielectric spacer having a second sidewall substantially co-planar with the first sidewall of the magnetic tunnel junction.

An embodiment a magnetoresistive random access memory (MRAM) device includes a magnetic tunnel junction (MTJ) disposed over a bottom electrode, the magnetic tunnel junction including a free layer, a top electrode disposed on the free layer of the magnetic tunnel junction, a first dielectric spacer supported by the free layer of the magnetic tunnel junction and extending along sidewalls of the top electrode, a second dielectric spacer disposed along sidewalls of the magnetic tunnel junction and the first dielectric spacer, and a dielectric layer covering the bottom electrode, the second dielectric spacer, the first dielectric spacer, and a portion of the top electrode.

An embodiment method for forming a magnetoresistive random access memory (MRAM) device includes forming magnetic tunnel junction (MTJ) layers over a bottom electrode layer supported by a substrate, forming a top electrode having a hard mask cover over the magnetic tunnel junction layers, capping the magnetic tunnel junction layers, the top electrode, and the hard mask cover with a first dielectric layer, removing horizontal portions of the first dielectric layer to expose an upper one of the magnetic tunnel junction layers and the hard mask cover, and removing peripheral portions of the first dielectric layer and the magnetic tunnel junction layers to form a first dielectric spacer on a magnetic tunnel junction.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A magnetoresistive random access memory (MRAM) device, comprising:
   a magnetic tunnel junction (MTJ) disposed over a bottom electrode, the magnetic tunnel junction having a first sidewall;
   a top electrode disposed over an upper surface of the magnetic tunnel junction;
   a dielectric spacer on the upper surface of the magnetic tunnel junction and extending along sidewalls of the top electrode, the dielectric spacer having a width along the upper surface of the magnetic tunnel junction equal to a distance from a sidewall of the top electrode to a sidewall of the magnetic tunnel junction; and
   a dielectric cover extending over the dielectric spacer and on at least a portion of the top electrode.

2. The MRAM device of claim 1, wherein the dielectric spacer abuts a free layer of the magnetic tunnel junction and the sidewalls of the top electrode.

3. The MRAM device of claim 1, wherein the dielectric spacer and the dielectric cover are formed from a same dielectric material.

4. The MRAM device of claim 1, wherein a dielectric spacer width is greater than a top electrode height and a top electrode width.

5. The MRAM device of claim 1, wherein a dielectric layer is disposed along magnetic tunnel junction sidewalls and dielectric spacer sidewalls.

6. The MRAM device of claim 1, wherein the dielectric spacer has a tapering width from a dielectric spacer bottom to a dielectric spacer top.

7. The MRAM device of claim 1, wherein a free layer of the magnetic tunnel junction defines a functional area disposed beneath top electrode and the dielectric spacer.

8. The MRAM device of claim 1, wherein a free layer of the magnetic tunnel junction is disposed on a pinning layer.

9. The MRAM device of claim 8, wherein the pinning layer of the magnetic tunnel junction is disposed on an anti-ferromagnetic layer.

10. A magnetoresistive random access memory (MRAM) device, comprising:
    a magnetic tunnel junction (MTJ) disposed over a bottom electrode, the magnetic tunnel junction including a free layer;
    a top electrode disposed on the free layer of the magnetic tunnel junction;
    a first dielectric spacer supported by the free layer of the magnetic tunnel junction and extending along sidewalls of the top electrode;
    a second dielectric spacer disposed along sidewalls of the magnetic tunnel junction and the first dielectric spacer;
    a dielectric layer covering the bottom electrode, the second dielectric spacer, the first dielectric spacer, and a portion of the top electrode; and
    an extremely low-k dielectric (ELK) is disposed over the dielectric layer.

11. The MRAM device of claim 10, wherein a nitrogen-free anti-reflective coating (NFARC) is disposed over the extremely low-k dielectric.

12. The MRAM device of claim 11, wherein a cavity extends through the nitrogen-free anti-reflective coating and the extremely low-k dielectric to expose the top electrode.

13. The MRAM device of claim 10, wherein the free layer includes a functional area beneath the top electrode and the first dielectric spacer.

14. A magnetoresistive random access memory (MRAM) device, comprising:
    a bottom electrode;
    a magnetic tunnel junction (MTJ) stack on the bottom electrode;
    a top electrode on a first surface of the MTJ stack, the MTJ stack having a width greater than a width of the top electrode;
    first spacers along sidewalls of the top electrode and on the first surface of the MTJ stack;
    second spacers along sidewalls of the first spacers and the MTJ stack, the second spacers not contacting the first surface of the MTJ stack; and a dielectric cover extending along sidewalls of the second spacers and over at least a portion of the top electrode.

15. The MRAM device of claim 14, wherein the second spacers are on the bottom electrode.

16. The MRAM device of claim 15, wherein sidewalls of the second spacers are aligned with sidewalls of the bottom electrode.

17. The MRAM device of claim 14, wherein the first spacers have a continually decreasing width as the first spacer extends away from the MTJ stack.

18. The MRAM device of claim 14, wherein a width of the first spacers is greater than a height of the top electrode.

19. The MRAM device of claim 14, wherein a width of the first spacers is greater than a width of the top electrode.

20. The MRAM device of claim 14, wherein the first surface of the MTJ stack is a surface of a free layer of the MTJ stack.

* * * * *